United States Patent
Ho et al.

(10) Patent No.: US 9,887,100 B2
(45) Date of Patent: Feb. 6, 2018

(54) METHODS OF FORMING SEMICONDUCTOR DEVICES AND STRUCTURES THEREOF

(71) Applicant: Taiwan Semiconductor Manufacturing Company, Ltd., Hsin-Chu (TW)

(72) Inventors: Chia-Cheng Ho, Hsin-Chu (TW); Tzu-Chiang Chen, Hsin-Chu (TW); Tsung-Lin Lee, Hsin-Chu (TW); Wei-Jen Lai, Keelung (TW); Chih Chieh Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 38 days.

(21) Appl. No.: 14/506,296

(22) Filed: Oct. 3, 2014

(65) Prior Publication Data

US 2016/0099244 A1    Apr. 7, 2016

(51) Int. Cl.

| | |
|---|---|
| H01L 27/088 | (2006.01) |
| H01L 29/78 | (2006.01) |
| H01L 21/321 | (2006.01) |
| H01L 21/02 | (2006.01) |
| H01L 21/3105 | (2006.01) |
| H01L 29/51 | (2006.01) |
| H01L 21/8234 | (2006.01) |
| H01L 29/66 | (2006.01) |
| H01L 21/8238 | (2006.01) |

(52) U.S. Cl.
CPC ........... *H01L 21/32115* (2013.01); *H01L 21/823431* (2013.01); *H01L 21/823821* (2013.01); *H01L 29/66545* (2013.01); *H01L 29/7848* (2013.01); *H01L 29/517* (2013.01)

(58) Field of Classification Search
CPC .................. H01L 27/0886; H01L 21/0217
See application file for complete search history.

(56) References Cited

U.S. PATENT DOCUMENTS

| | | | |
|---|---|---|---|
| 6,852,645 B2 * | 2/2005 | Colombo | C23C 28/00 257/E21.01 |
| 2005/0260810 A1 * | 11/2005 | Cheng | H01L 21/82380 438/199 |
| 2011/0101421 A1 * | 5/2011 | Xu | H01L 21/02381 257/255 |
| 2012/0329259 A1 * | 12/2012 | Lu | H01L 29/66545 438/586 |
| 2013/0062669 A1 * | 3/2013 | Chen | H01L 29/401 257/288 |

(Continued)

*Primary Examiner* — Su C Kim
*Assistant Examiner* — David S Wilbert
(74) *Attorney, Agent, or Firm* — Slater Matsil, LLP

(57) ABSTRACT

Methods of forming semiconductor devices and structures thereof are disclosed. In some embodiments, a semiconductor device includes a substrate that includes fins. Gates are disposed over the fins, the gates being substantially perpendicular to the fins. A source/drain region is disposed on each of fins between two of the gates. A contact is coupled to the source/drain region between the two of the gates. The source/drain region comprises a first width, and the contact comprises a second width. The second width is substantially the same as the first width.

20 Claims, 7 Drawing Sheets

(56) References Cited

U.S. PATENT DOCUMENTS

| | | | |
|---|---|---|---|
| 2014/0084383 A1* | 3/2014 | Cai | H01L 29/66545 257/401 |
| 2014/0312397 A1* | 10/2014 | Cheng | H01L 21/283 257/288 |
| 2015/0041898 A1* | 2/2015 | Loubet | H01L 29/785 257/347 |
| 2015/0064854 A1* | 3/2015 | Leobandung | H01L 27/1211 438/157 |
| 2015/0214341 A1* | 7/2015 | Shin | H01L 29/66818 257/401 |

* cited by examiner

METHODS OF FORMING SEMICONDUCTOR DEVICES AND STRUCTURES THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is utilized extensively in semiconductor devices. There may be thousands of transistors on a single integrated circuit (IC) in some applications, for example. One common type of transistor used in semiconductor device fabrication is a metal oxide semiconductor field effect transistor (MOSFET).

Multiple gate field-effect transistors (MuGFETs) are a recent development in semiconductor technology which typically are MOSFETs that incorporate more than one gate into a single device. The multiple gates may be controlled by a single gate electrode, where the multiple gate surfaces act electrically as a single gate. The multiple gates may also be controlled by independent gate electrodes. One type of MuGFET is referred to as a fin field effect transistor (FinFET) device, which is a transistor structure with a fin-like semiconductor channel that is raised vertically out of the silicon surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
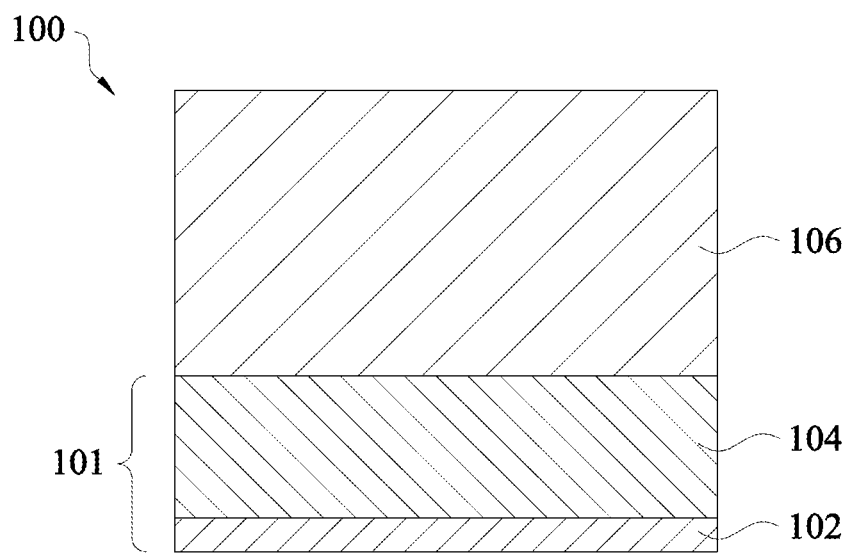
FIGS. 1, 3, 5, 7, and 9 through 13 are cross-sectional views that illustrate a method of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure comprise semiconductor devices wherein a sidewall spacer is not used on dummy gates or in the formation of contacts to source and drain regions of a FinFET device. A nitride sacrificial material is used for the material of dummy gates, which does not require the use of a sidewall spacer. Contact area and source/drain region volume are increased, and a closer proximity of the source/drain regions to a channel region of the FinFET device is also achieved.

FIGS. 1, 3, 5, 7, and 9 through 13 are cross-sectional views that illustrate a method of manufacturing a semiconductor device 100 at various stages in accordance with some embodiments. FIGS. 2, 4, 6, 8, and 14 are perspective views of the cross-sectional views of the semiconductor devices 100 shown in FIGS. 1, 3, 4, 7, and 13, respectively.

Figure 2:
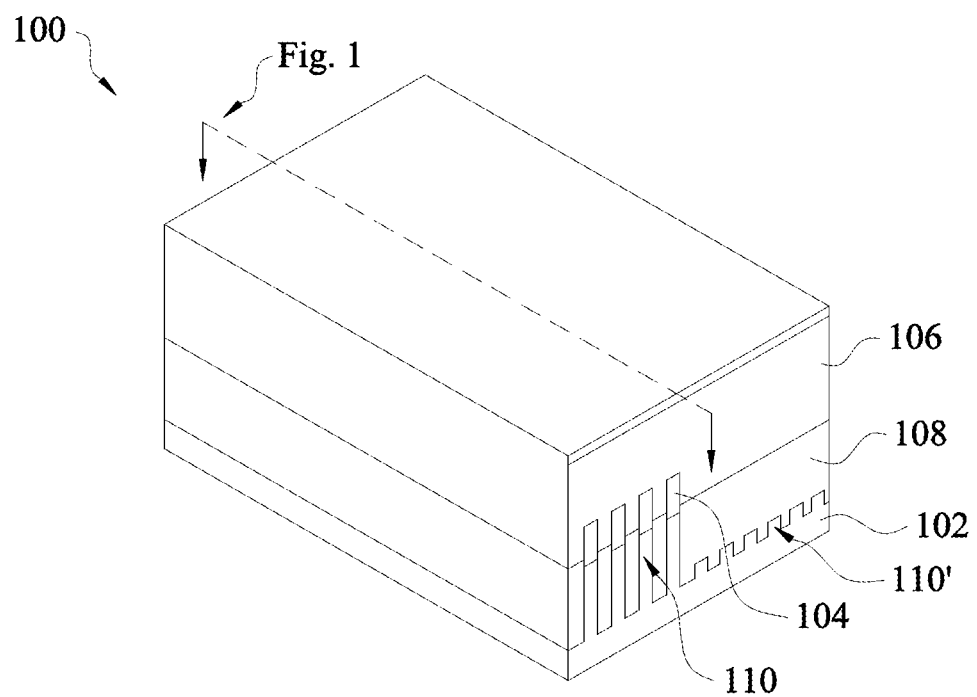
FIGS. 2, 4, 6, 8, and 14 are perspective views that illustrate a method of manufacturing a semiconductor device at various stages in accordance with some embodiments.

Referring first to FIG. 1, to manufacture the semiconductor device 100, a substrate 101 is provided. The substrate 101 has a plurality of fins 110 extending therefrom, which is shown in FIG. 2. FIG. 1 is a view along a length of one of the fins 110 shown in FIG. 2. The substrate 101 comprises a first semiconductive material 102 and a second semiconductive material 104 disposed over the first semiconductive material 102 in some embodiments.

The first semiconductive material 102 of the substrate 101 may include a semiconductor substrate comprising silicon (Si) or other semiconductor materials and may, or may not be, covered by an insulating layer in some areas, for example. The first semiconductive material 102 may include active components or circuits, not shown. The first semiconductive material 102 may comprise silicon oxide over single-crystal silicon, for example. The first semiconductive material 102 may include conductive layers or semiconductor elements, e.g., transistors, diodes, etc., formed therein. Compound semiconductors such as GaAs, InP, SiGe, or SiC, as examples, may be used in place of Si or Ge. The first semiconductive material 102 may comprise a bulk substrate, a semiconductor-on-insulator (SOI) substrate, or other types of wafers, for example.

The first semiconductive material 102 is formed of a semiconductor material having a first lattice constant in some embodiments. The second semiconductive material 104 has a second lattice constant that is different than the first lattice constant in some embodiments. In some embodiments, the first semiconductive material 102 comprises a crystalline silicon substrate (e.g., wafer) or other suitable elemental semiconductor, and the second semiconductive material 104 comprises a compound semiconductive material, such as SiGe, GaAs, InGaAs, or the like, for example. The second semiconductive material 104 comprises a high mobility material having a higher mobility than the first semiconductive material 104 in some embodiments.

The second semiconductive material 104 may be formed over the first semiconductive material 102 using an epitaxial growth process, atomic layer deposition (ALD), or chemical vapor deposition (CVD), as examples. The first semiconductive material 102 comprises a thickness of about 500 μm to about 1,000 μm, and the second semiconductive material 104 comprises a thickness of about 10 nm to about 200 nm in some embodiments. Alternatively, the first semiconductive material 102 and the second semiconductive material 104 may comprise other materials, dimensions, and formation methods.

The substrate 101 also may include other features. For example, the substrate 101 may include various doped regions depending on design requirements (e.g., a p-type substrate or n-type substrate). The doped regions may be doped with p-type dopants, such as boron or $BF_2$, n-type dopants, such as phosphorus or arsenic, and/or combinations thereof, as examples. The doped regions may be configured for an n-type FinFET or a p-type FinFET.

To form the plurality of fins 110, the substrate 101 may be patterned using, for example, photolithography techniques. For example, a mask layer, such as a pad oxide layer and an overlying pad nitride layer (not shown), may be formed over the substrate 101. The pad oxide layer may be a thin film comprising silicon oxide formed, for example, using a thermal oxidation process. The pad oxide layer may act as an adhesion layer between the substrate 101 and the overlying pad nitride layer and may act as an etch stop layer for etching the pad nitride layer. In some embodiments, the pad nitride layer is formed of silicon nitride, for example, formed using low-pressure chemical vapor deposition (LPCVD: a CVD process with a pressure level standby level of about 1e-7 millibar (mbar) to about 500 mbar and a process state level of about 0.1 mbar to about 10 mbar) or plasma enhanced chemical vapor deposition (PECVD), as examples.

The mask layer may be patterned using photolithography techniques. Generally, photolithography techniques utilizes a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is patterned to define the pad oxide and pad nitride, which collectively comprises a patterned mask.

The patterned mask is subsequently used to pattern exposed portions of the substrate 101 to form trenches, thereby defining the plurality of fins 110 between adjacent trenches, as illustrated in FIG. 2. The trenches are partially filled with a dielectric material such as insulating material 108, which forms isolation regions such as shallow trench isolation (STI) regions or field oxide (FOX) regions adjacent the fins 110. The insulating material 108 may comprise $SiO_2$, $Si_xN_y$, SiON, or multiple layers or combinations thereof, as examples. Alternatively, the insulating material 108 may comprise other materials.

In some embodiments, the trenches and fins 110 may comprise strips (viewed from in the top) that run in parallel to each other, and are closely spaced with respect to each other. In some embodiments, the trenches may be continuous and may surround the fins 110. A top portion of the insulating material 108 is removed (for example, using an etch process or other process) to expose at least the second semiconductive material 104, as illustrated in FIGS. 1 and 2.

Note that in FIG. 1, fins 110' are shown to the right of the fins 110. The fins 110' comprises dummy fins or unused fins that are comprised of a portion of the first semiconductive material 102 and have a smaller height than fins 110. The dummy fins 110' are not included in some embodiments, and are not labeled in the other perspective view drawings of the present disclosure.

In accordance with some embodiments of the present disclosure, a sacrificial material 106 is formed over the substrate 101, also shown in FIGS. 1 and 2. The sacrificial material 106 comprises a nitride, and may comprise silicon nitride in some embodiments. The sacrificial material 106 comprises a thickness of about 50 nm to about 200 nm and is deposited using ALD or CVD. Alternatively, the sacrificial material 106 may comprise other materials, dimensions, and formation methods.

Figure 3:
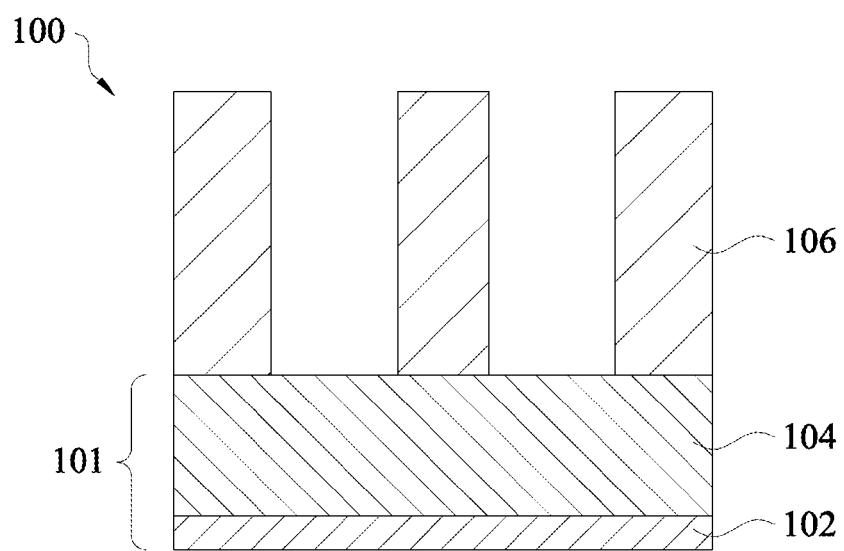
Figure 4:
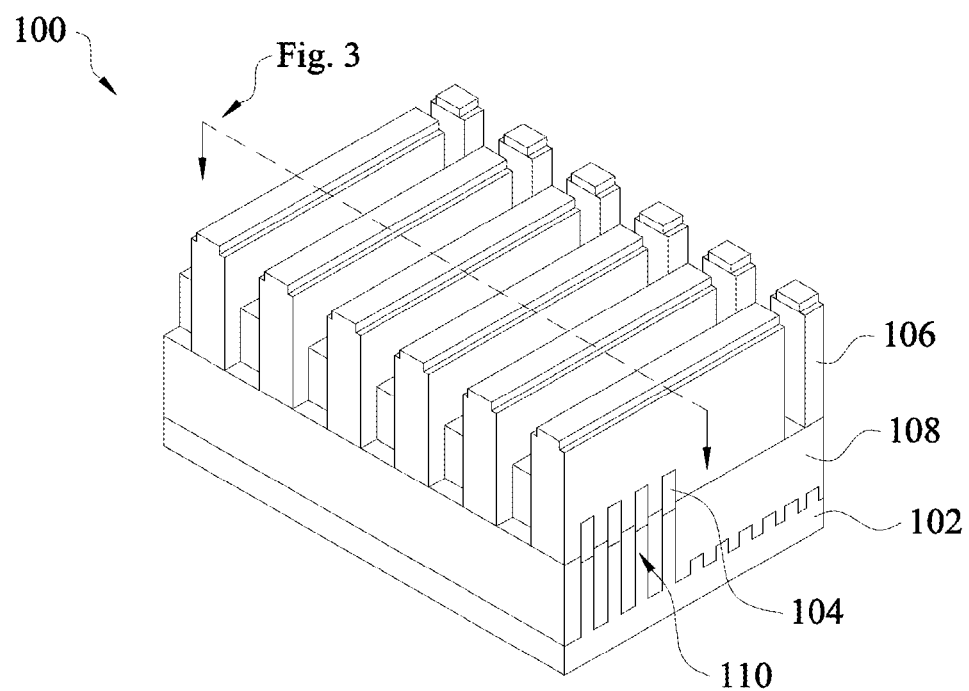

The sacrificial material 106 is patterned using a photolithography process, as shown in FIG. 3 in a cross-sectional view and in FIG. 4 in a perspective view. The sacrificial material 106 is patterned using photolithography, by depositing a photoresist material (not shown) that is deposited over the sacrificial material 106, irradiated or exposed using a lithography mask, and developed to remove a portion of the photoresist material. The remaining photoresist material protects the underlying sacrificial material 106 during a subsequent etching process, during which portions of the sacrificial material 106 are etched away and removed, as shown in FIGS. 3 and 4.

The sacrificial material 106 is patterned with a pattern for a plurality of gates. For example, the sacrificial material 106 left remaining after the etch process comprises a plurality of dummy gates. The portions of the sacrificial material 106 left remaining reside in a desired location for gates of a FinFET device, for example. The patterning and etch process for the sacrificial material 106 comprises a gate photolithography and etch process in some embodiments, for example, to form a plurality of dummy gates that are comprised of the patterned sacrificial material 106.

The patterned sacrificial material 106 extends lengthwise across the plurality of fins 110, as can be seen in FIG. 4. A portion of the fins 110 is exposed and is visible between the patterned sacrificial material 106. The patterning process for the sacrificial material 106 leaves a top surface of the plurality of fins 110 exposed, for example. The sacrificial material 106 left remaining resides over other portions of the fins 110 and over the insulating material 108. The sacrificial material 106 left remaining resides over portions of the fins 110 that will comprise a channel region of the FinFET devices, to be described further herein.

The sacrificial material 106 width and spacing is a function of the device generation of the semiconductor device 100 in some embodiments. As an example, for a 20 nm generation, the width of each portion of the sacrificial material 106 may comprise about 20 nm and the center-to-center spacing between the portions of the sacrificial material 106 may comprise about 64 nm. As devices are scaled down in future generations of technology, these dimensions will decrease, for example. If other device generations (e.g., older generations) are used, the width and spacing will be larger. Alternatively, the width and spacing of the sacrificial material 106 may comprise other dimensions.

Referring next to FIGS. 5 through 8, source and drain regions 112 (see FIGS. 7 and 8) are then formed between the patterned sacrificial material 106. The FinFET devices of the semiconductor device 100 may comprise both NMOS device (n channel MOS) regions and PMOS (p channel) device regions. The source and drain regions 112 of the NMOS device regions and the PMOS device regions are processed and formed separately in some embodiments, for example. The materials and/or formation processes of the source and drain regions 112 may be different for the NMOS and PMOS device regions of a FinFET device in some embodiments, for example. Thus, NP (two separate n-channel and p-channel) patterning and epitaxial processes are next performed.

For example, a first photoresist (not shown) is applied and is then removed from the NMOS device regions. The first photoresist is left remaining in the PMOS device regions while the etching and epitaxial growth of source/drains of the NMOS device regions is performed. The first photoresist is then removed, and a second photoresist is applied and removed from the PMOS device regions. The second photoresist is left remaining in the NMOS device regions while the etching and epitaxial growth of source/drains of the PMOS device regions is performed. The second photoresist is then removed.

Figure 5:
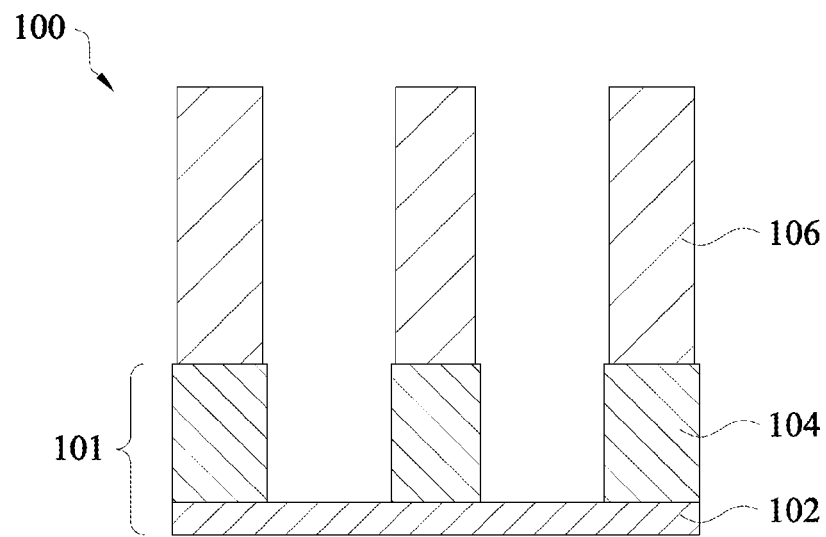
Figure 6:
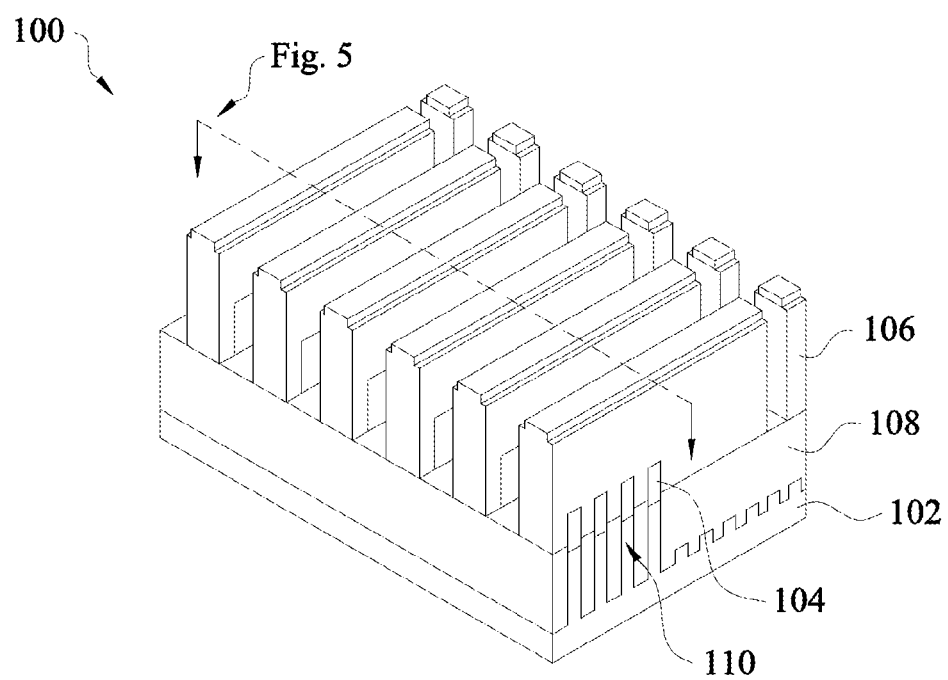

FIGS. 5 through 8 show an etch process and epitaxial growth process for either an NMOS device region or a PMOS device region of a FinFET device in accordance with some embodiments. In FIG. 5, a top portion of the plurality of fins 110 of the substrate 101 is etched or recessed. The top portion of the substrate 101 protruding from the insulating material 108 is recessed, for example. The second semiconductive material 104 of the fins 110 of the substrate 101 is removed using an etch process, for example. A top portion of the first semiconductive material 102 may also be removed during the etch process, not shown. Only a top portion of the second semiconductive material 104 of the fins 110 may be removed in some embodiments, also not shown. FIG. 6 shows a perspective view of the semiconductor device 100 after the etch process used to recess the top portion of the plurality of fins 110. The second semiconductive material 104 of the fins 110 covered by the sacrificial material 106 is left remaining.

Advantageously, because a sidewall spacer is not included on sidewalls of the sacrificial material 106, there is less process variability in the recess process of the fins 110, and a proximity to channel regions (not labeled in FIG. 5; see channel regions 132 within the second semiconductive material 104 beneath the gates 128 in FIG. 11) of about zero can be achieved during the recess process. Furthermore, a lower cost etch process with a lower complexity can be used to recess the fins 110 without a sidewall spacer, and costs of an additional material layer and an additional processing step to include a sidewall spacer in the structure is avoided.

Figure 7:
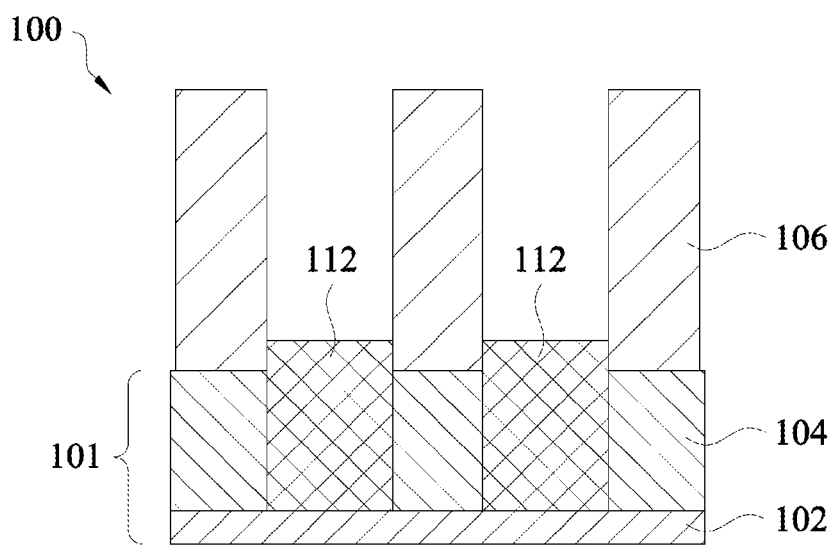
Figure 8:
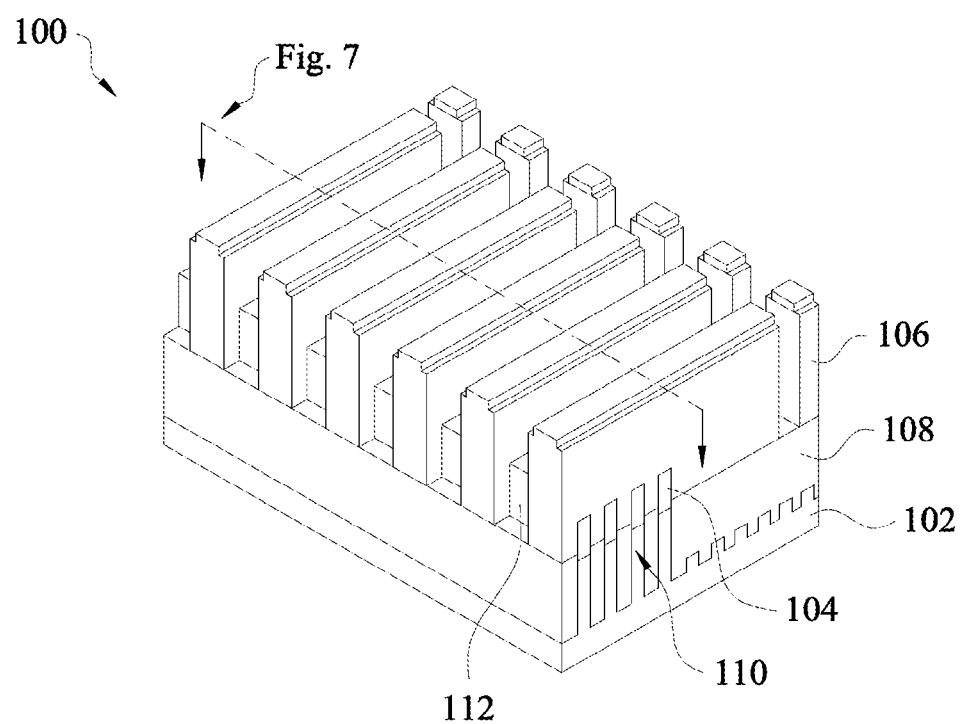

An epitaxial growth process is then used to form epitaxially grown material 112 in the recesses of the top portion of the fins 110, as shown in FIGS. 7 and 8. The material 112 is epitaxially grown over the recessed top portion of the substrate 101, for example. The epitaxially grown material 112 comprises source and drain regions 112 (also referred to herein as source/drain regions) of the FinFET device. The source and drain regions 112 comprise an epitaxially grown semiconductive material that is grown from the first semiconductive material 102 of the substrate 101. Precursors can be added into a chamber that the semiconductor device 100 is being processed in to grow the source and drain regions 112 over the first semiconductive material 102, for example. The source and drain regions 112 may comprise substantially the same or a greater height or thickness as the second semiconductive material 104, for example. The source and drain regions 112 may have a height or thickness that is about 0 nm to about 100 nm greater than the thickness of the second semiconductive material 104, as an example. The source and drain regions 112 may comprise SiGe, SiC, SiCP, SiGeB, SiP, GeP, GeB, SiGeSn, GeSn, and/or other compound semiconductor materials or other materials, as examples. Alternatively, the source and drain regions 112 may comprise other materials and dimensions, and the source and drain regions 112 may be formed using other methods.

Because an epitaxial growth process is used to form the source and drain regions 112 in some embodiments, the epitaxially grown material is advantageously not formed over the insulating material 108, as shown in FIG. 8. Thus, the source and drain regions 112 are self-aligned. Furthermore, because a sidewall spacer is not included on sidewalls of the sacrificial material 106, the source and drain regions 112 that comprise epitaxially grown material have a larger volume, and the source and drain region 112 epitaxially grown material is formed nearer or closer to the channel regions (not labeled in FIG. 7; see channel regions 132 within the second semiconductive material 104 beneath the gates 128 in FIG. 11).

Figure 9:
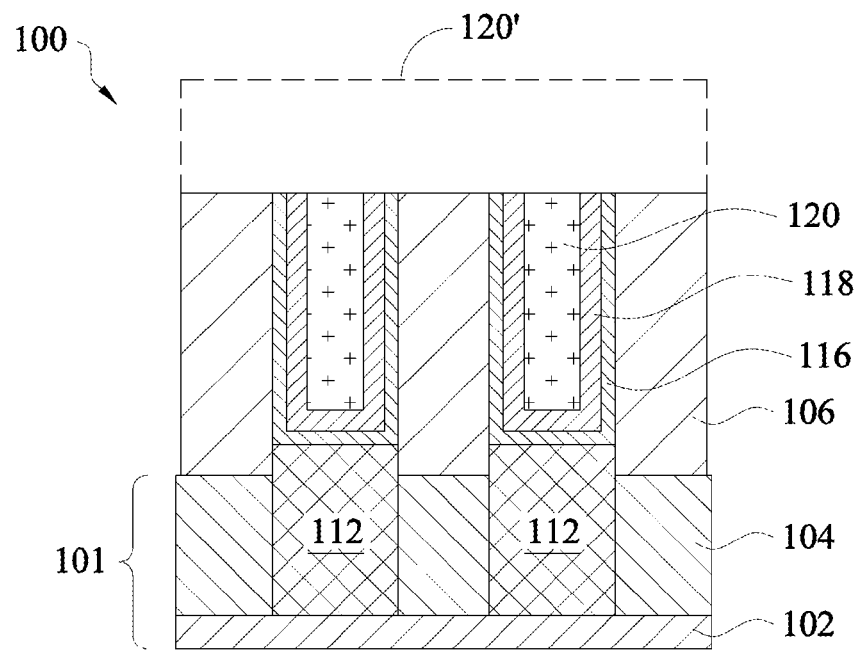

Referring next to FIG. 9, an insulating material 116/118/120 is then formed over the sacrificial material 106 and the epitaxially grown material 112. The insulating material 116/118/120 is also referred to herein, e.g., in some of the claims, as a first insulating material 116/118/120. The insulating material 116/118/120 comprises a first layer 116 comprising a buffer oxide 116 in some embodiments. The buffer oxide 116 comprises $SiO_2$ or other oxide material comprising a thickness of about 1 nm to about 30 nm, for example. The buffer oxide 116 is formed over the top surfaces and sidewalls of the sacrificial material 106 and also over top surfaces of the source and drain regions 112. The insulating material 116/118/120 comprises a second layer 118 comprising a contact etch stop layer (CESL) 118 that is formed over the first layer 116. The CESL 118 may comprise SiN or SiON comprising a thickness of about 1 nm to about 30 nm, as examples. The insulating material 116/118/120 also comprises a third layer 120 comprising an interlayer dielectric (ILD) 120 that is formed over the CESL 118. The ILD 120 comprises $SiO_2$ or other oxide materials comprising a thickness of about 10 nm to about 100 nm, for example. Alternatively, the buffer oxide 116, CESL 118, and ILD 120 may comprise other materials and dimensions.

The buffer oxide 116, CESL 118, and/or ILD 120 may be formed using CVD, PECVD, rapid thermal CVD (RTCVD: a CVD process using rapid thermal heating at a temperature of about 1,500 degrees C. for about 10 seconds or less, at a pressure of about 1 μTorr to about 100 torr), ultra high vacuum CVD (UHVCVD: a CVD process having a pressure level standby level of less than about 5E-7 torr and a process state level of about 1 torr to about 500 torr), LPCVD, MOCVD, or ALD, as examples. Alternatively, the buffer oxide 116, CESL 118, and/or ILD 120 of the insulating material 116/118/120 may be formed using other methods.

The insulating material 116/118/120 is formed over top surfaces of the sacrificial material 106 as-deposited, as shown in phantom (e.g., in dashed lines) at 120' in FIG. 9. The insulating material 116/118/120 is removed from over the top surfaces of the sacrificial material 106, also shown in FIG. 9. The insulating material 116/118/120 may be removed using a grinding process, a chemical-mechanical polishing (CMP) process, an etch process, or a combination thereof, as examples. The insulating material 116/118/120 is planarized to remove the insulating material 116/118/120 from over a top surface of the sacrificial material, for example. The insulating material 116/118/120 may also be formed using other methods.

Figure 10:
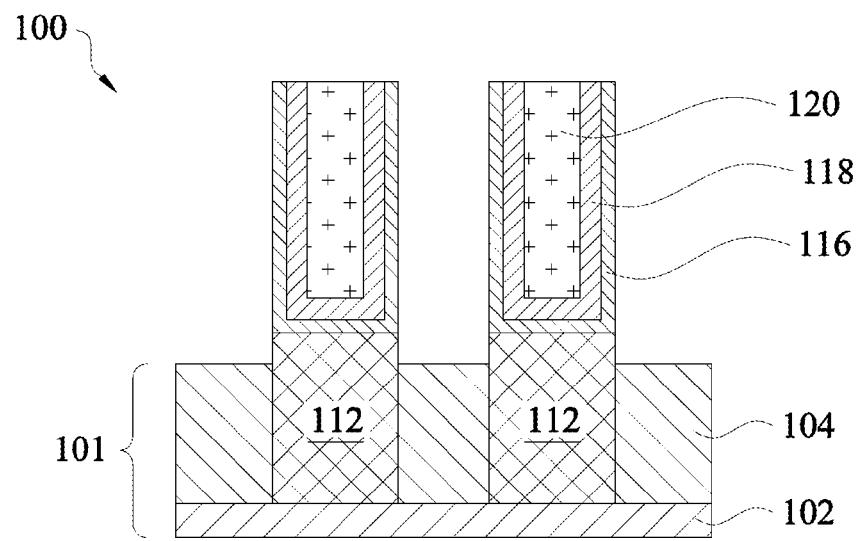

The sacrificial material 106 is then removed using an etch process, as shown in FIG. 10. The sacrificial material 106 comprises a material with an etch selectivity to the insulating material 116/118/120 to facilitate in the removal of the sacrificial material 106. The sacrificial material 106 comprises a shape of a plurality of dummy gates, so that the surfaces and spaces above the second semiconductive material 104 of the fins 110 between the insulating material 116/118/120 comprises a desired shape for gates that will be formed next.

Figure 11:
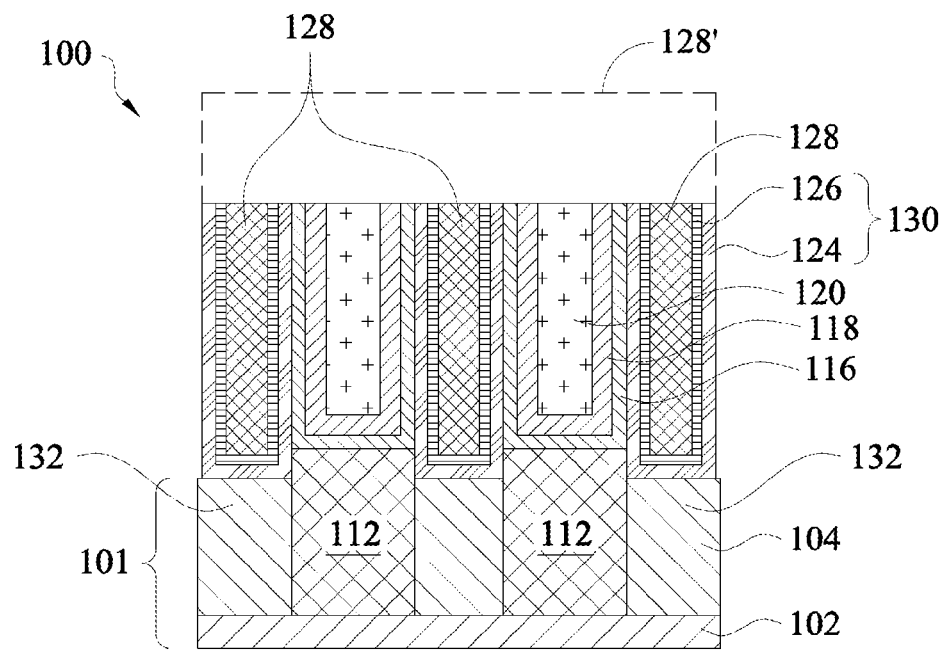

Referring next to FIG. 11, a "gate loop" deposition process is then performed on the semiconductor device 100. Insulating materials 124 and 126 are formed, followed by the formation of conductive material 128. The gate loop deposition process comprises depositing material layers 124, 126, and 128.

The insulating material 124 is formed over top surfaces and sidewalls of the insulating material 116/118/120, exposed portions of the second semiconductive material 104, and sidewalls of the top of the source and drain regions 112. The insulating material 124 comprises an interface layer (IL) in some embodiments. The IL 124 comprises an oxide such as $SiO_2$, for example. In some embodiments, the IL 124 comprises a high quality $SiO_2$; for example, the IL 124 comprising $SiO_2$ is very thin, i.e., about 2 nm or less, has low defects (i.e., about Dit<1E11 cm-2ev-1), and has low leakage current (i.e., about <0.01 A/cm2 at V=0.8V). The IL 124 may be formed using CVD, PECVD, RTCVD, UHVCVD, LPCVD, MOCVD, ALD, thermal oxidation, or chemical oxidation, as examples. Alternatively, the IL 124 may comprise other materials, dimensions, and formation methods. In some embodiments, the IL 124 is not included.

The insulating material 126 is formed over the IL 124, also shown in FIG. 11. In embodiments wherein the IL 124 is not included, the insulating material 126 is formed over top surfaces and sidewalls of the insulating material 116/118/120, exposed portions of the second semiconductive material 104, and sidewalls of the top of the source and drain regions 112. The insulating material 126 comprises a high dielectric constant (k) insulating material comprising an insulating material having a dielectric constant or k value of greater than about 3.9, which is the dielectric constant of $SiO_2$, for example. Insulating material 126 comprises a gate dielectric in some embodiments. In some embodiments, insulating material 126 comprises $HfO_2$, HfSiO, $Y_2O_3$, an oxide of Zr, an oxide of La, an oxide of Ti, an oxide of Ta, and the like. The insulating material 126 comprises a thickness of about 0.5 nm to about 10 nm, for example. The insulating material 126 may be deposited using physical vapor deposition (PVD), CVD, PECVD, RTCVD, UHVCVD, LPCVD, MOCVD, or ALD, as examples. Alternatively, the insulating material 126 may comprise other materials, dimensions, and formation methods.

In some embodiments, both of the insulating materials 124 and 126 combined comprise a gate dielectric 130 of the FinFET device, for example. In embodiments wherein insulating material 124 is not included, insulating material 126 comprises the gate dielectric 130 of the FinFET device.

The conductive material 128 is formed over the insulating material 126, also shown in FIG. 11. The conductive material 128 comprises a gate material in some embodiments. The conductive material 128 comprises a metal, such as TiN, TiSiN, TaN TaSiN, W, Al, Ti, Cu, TiAl, AlTi, and the like, or combinations or multiple layers thereof, as examples. The conductive material 128 comprises a metal gate (MG) material in some embodiments, for example. The conductive material 128 comprises a thickness of about 1 nm to about 20 nm, for example. The conductive material 128 is formed using a deposition method such as PVD, CVD, PECVD, RTCVD, UHVCVD, LPCVD, MOCVD, or ALD, as examples. Alternatively, the conductive material 128 may comprise other materials, dimensions, and formation methods.

As-deposited, insulating material 124, insulating material 126, and conductive material 128 are formed over top surfaces of the insulating material 116/118/120 in some embodiments, as shown in phantom at 128'. The insulating material 124, insulating material 126, and conductive material 128 are removed from over the top surfaces of the insulating material 116/118/120, also shown in FIG. 11. The insulating material 124, insulating material 126, and conductive material 128 may be removed using a grinding process, a CMP process, an etch process, or a combination thereof, as examples. The gate material comprising the conductive material 128 and the gate dielectric 130 are planarized to remove the gate material 128 and the gate dielectric 130 from over the top surface of the first insulating material 116/118/120 in some embodiments, for example. The insulating material 124, insulating material 126, and conductive material 128 may also be formed using other methods.

After the removal of the insulating material 124, insulating material 126, and conductive material 128 from over the top surfaces of the insulating material 116/118/120, a plurality of gates 128 are formed from the gate material 128. The gate material 128 left behind after the planarization process comprises a plurality of gates 128, for example. Each of the plurality of gates 128 is disposed over a channel region 132 of a fin 110 comprising the second semiconductive material 104. A source/drain region 112 is disposed on each of the plurality of fins 110 between two of the plurality of gates 128. A source/drain region 112 is disposed on each fin 110 between each two adjacent gates 128, for example. The gate dielectric 130 is disposed on a bottom surface and sidewalls of each of the plurality of gates 128.

Figure 12:
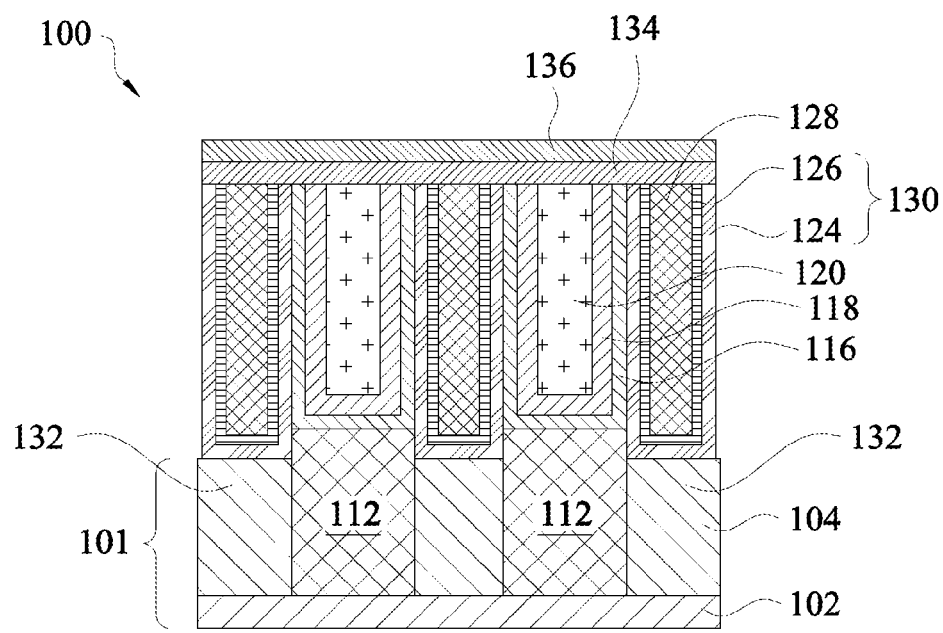

Next, an insulating material 134/136 is formed over the insulating material 116/118/120, the IL 124, the insulating material 126, and the gates 128, as shown in FIG. 12. The insulating material 134/136 is also referred to herein, e.g., in some of the claims, as a second insulating material 134/136. The insulating material 134/136 comprises a first layer 134 which comprises a CESL 134 in some embodiments, for example. The CESL 134 may comprise similar materials, dimensions, and formation methods as described for CESL 118 of the first insulating material 116/118/120, for example. The insulating material 134/136 comprises a second layer 136 which comprises an ILD 136 that is formed over the CESL 134. The ILD 136 may comprise similar materials, dimensions, and formation methods as described for the ILD 120 of the first insulating material 116/118/120, for example. Alternatively, the first layer 134 and the second layer 136 of the insulating material 134/136 may comprise other materials, dimensions, and formation methods.

After the formation of the ILD 136 of the insulating material 134/136, a CMP process is then performed, in some embodiments. In other embodiments, a CMP process is not performed after the formation of the ILD 136.

Figure 13:
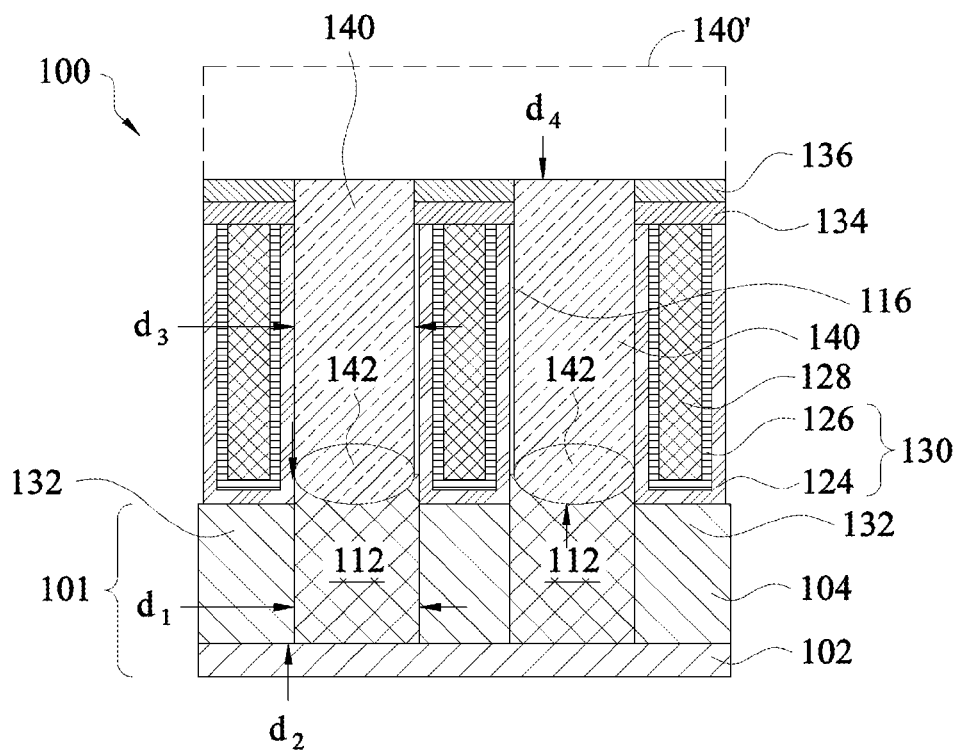
Figure 14:
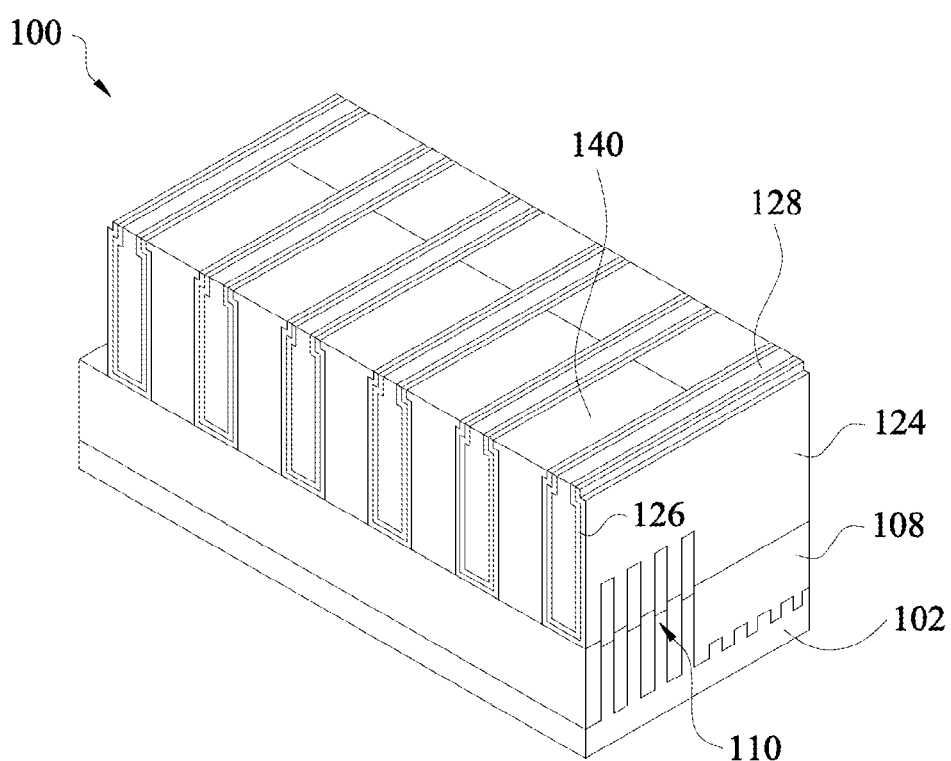

The second insulating material 134/136 and the first insulating material 116/118/120 are then removed from over the source and drain regions 112, as shown in FIGS. 13 and 14, and a contact 140 is formed in each location where the insulating material 116/118/120 was located, also shown in FIGS. 13 and 14. A contact 140 is formed in spaces where the insulating materials 134/136 and 116/118/120 were removed, for example. In some embodiments, the second insulating material 134/136 and the first insulating material 116/118/120 are removed by patterning the second insulating material 134/136 and the first insulating material 116/118/120 using a photolithography process. In other embodiments, a portion of the second insulating material 134/136 and the first insulating material 116/118/120 is removed from over the source and drain regions 112, for example.

In some embodiments, the same lithography mask that was used to pattern the sacrificial material 106 may advantageously be used to pattern the second insulating material 134/136 and the first insulating material 116/118/120, for example. Using the same lithography mask results in a cost savings, for example. Alternatively, a different lithography mask may be used.

The contacts 140 comprise source and drain contacts for the FinFET device. Each contact 140 is coupled to a source/drain region 112 between two of the plurality of gates 128. A contact 140 is formed between each two adjacent gates 128 along the length of the gates 128 in some embodiments, for example, as shown in FIG. 14.

Referring again to FIG. 13, in some embodiments, a silicide material 142 is formed over the epitaxially grown material 112 comprising the source and drain regions, before the material of the contacts 140 is deposited. The silicide material 142 may be formed by directly depositing the silicide material 142 in some embodiments. In other embodiments, the silicide material 142 is formed by deposition of a metal on top surfaces of the source and drain regions 112 followed by a reaction between the metal and a material of the source and drain regions 112. Other silicide formation methods may alternatively be used to form the silicide material 142. In other embodiments, a silicide material 142 is not included.

The contacts 140 comprise W, Cu, Al, Ti, PtSi, Pt, $TiSi_2$, $WSi_2$, other metals, or combinations and multiple layers thereof, for example. The contacts 140 may be formed using PVD, CVD, and ALD, as examples. Forming the contacts 140 comprises forming a metal over the silicide material 142 in some embodiments. The contact 140 material as-deposited may extend over a top surface of the ILD 136, as shown in phantom at 140' in FIG. 13. Excess contact 140 material may be removed using a removed using a grinding process, a CMP process, an etch process, or a combination thereof, as examples, leaving the semiconductor device 100 structures shown in FIGS. 13 and 14 comprising FinFET devices. Note that insulating material 134/136 is not shown in FIG. 14 for simplification of the drawing.

FIG. 13 also illustrates some dimensions of portions of the semiconductor device 100. The source and drain regions 112 comprising the epitaxially grown material comprise a width comprising dimension $d_1$, wherein dimension $d_1$ comprises about 150 nm or less in some embodiments, for example. Dimension $d_1$ is also referred to herein, e.g., in some of the claims, as a first width. The source and drain regions 112 comprising the epitaxially grown material comprise a height or thickness comprising dimension $d_2$, wherein dimension $d_2$ comprises about 10 nm to about 100 nm in some embodiments, for example. The contacts 140 comprise a width comprising dimension $d_3$, wherein dimension $d_3$ comprises about 150 nm or less in some embodiments, for example. Dimension $d_3$ is also referred to herein, e.g., in some of the claims, as a second width. The contacts 140 and silicide material 142 together comprise a height or thickness comprising dimension $d_4$, wherein dimension $d_4$ comprises about 200 nm to about 800 nm in some embodiments, for example. Alternatively, dimensions $d_1$, $d_2$, $d_3$, and $d_4$ may comprise other values, e.g., depending on the technology generation.

Advantageously, in some embodiments, because a sidewall spacer material is not included in the structure adjacent sidewalls of the contacts 140 (e.g., between the insulating material 124 or 126 and the sidewalls of the contacts 140), the second width comprising dimension $d_3$ of the contacts 140 is substantially the same as the first width comprising dimension $d_1$ of the source and drain regions 112. This results in a larger area for landing of the contacts 140. Furthermore, because a sidewall spacer material is not included in the structure adjacent sidewalls of the contacts 140, a volume of the source and drain regions 112 is increased (e.g., the first width $d_1$ is increased, which increases the volume of the source and drain regions 112), and the source and drain regions 112 are also advantageously formed closer to the channel regions 132 within the fins 110 comprising the second semiconductive material 104. An insulating spacer material is not disposed between sidewalls of the contacts 140 and the gate dielectric 130 in some embodiments, for example.

In some embodiments, a small amount (e.g., about 1 nm to about 20 nm) of the buffer oxide 116 of the first insulating material 116/118/120 may remain residing on sidewalls of the IL 124 after the patterning step for the second insulating material 134/136 and the first insulating material 116/118/120. This may result from the patterning step in some embodiments, but does not have a deleterious effect on the semiconductor device 100. In other embodiments, an amount of the buffer oxide 116 is not left remaining in the structure.

After the manufacturing process stage shown in FIGS. 13 and 14, additional insulating material layers (not shown) may be formed over the semiconductor device 100 comprising the FinFET device, and additional contacts (also not shown) may be formed within the insulating material layers that make electrical connection to other portions of the FinFET device, such as to the gates 128, for example. Conductive lines and vias may be formed over the FinFET device in a back-end-of-line (BEOL) process, for example, also not shown.

The semiconductor device 100 comprises a plurality of the FinFET devices in some embodiments. Some of the FinFET devices of the semiconductor device 100 may comprise input/output devices in some embodiments, for example. The input/output devices may be coupled to wiring in conductive layers of the semiconductor device 100 that is coupled to contacts proximate an exterior (e.g., a surface) of the semiconductor device 100, so that electrical contact may be made to others of the FinFET devices, for accessing, selecting, controlling, and other actions related to the other FinFET devices that may comprise core devices in some embodiments. The core devices may be adapted to perform predetermined functions of the semiconductor device 100, such as logic, processing, memory, or other functions, for example.

Embodiments of the present disclosure include methods of manufacturing semiconductor devices 100, and also include semiconductor devices 100 that have been manufactured using the methods described herein. Embodiments of the present disclosure include methods of manufacturing FinFET devices, and also include FinFET devices that have been manufactured using the methods described herein.

The semiconductor devices 100 may comprise complementary metal oxide semiconductor (CMOS) FinFET devices in some embodiments. Embodiments of the present disclosure are implementable in FinFET devices comprising n channel FETs (NFETs) and/or p channel FETs (PFETs), for example.

Advantages of some embodiments of the present disclosure include providing semiconductor devices wherein a sidewall spacer is not used during formation of dummy gate structures. The absence of a sidewall spacer on the dummy gate structure comprising a nitride sacrificial material described herein results in source and drain regions having a greater width and thus a larger volume. Furthermore, the source and drain regions have a closer proximity to the channel region. In some embodiments, the source and drain regions are directly adjacent and abut the channel regions, for example, which improves device performance and results in less process variability. The contact area of the contacts to the source and drain regions is increased, which results in less resistance and increases conductivity. For example, without a sidewall spacer, there is more contact area for contact landing.

Using a nitride for the sacrificial material simplifies the manufacturing process flow for FinFET devices. The nitride sacrificial material provides a lower cost process, allows for pitch shrinkage (e.g., geometry shrinkage), and provides a self-aligned proximity push for the epitaxially grown source and drain regions. Including the nitride sacrificial material in the process flow also results in increased stress being formed in the channel region during the source/drain epitaxial growth process, which enhances transistor performance. For example, without a sidewall spacer, recess etching with no proximity issues is facilitated, and then the source/drain epitaxial growth can provide increased channel stress. The need for lateral etching when recessing the semiconductor fins prior to the epitaxial growth of the source and regions is avoided in some embodiments, for example. Furthermore, the manufacturing processes and structures described herein are easily implementable in manufacturing process flows.

In some embodiments, a semiconductor device includes a substrate comprising a plurality of fins, and a plurality of gates disposed over the plurality of fins. The plurality of gates is substantially perpendicular to the plurality of fins. A source/drain region is disposed on each of the plurality of fins between two of the plurality of gates. A contact is coupled to the source/drain region between the two of the plurality of gates. The source/drain region comprises a first width, and the contact comprises a second width. The second width is substantially the same as the first width.

In other embodiments, a method of forming a semiconductor device includes forming a sacrificial material over a substrate, the sacrificial material comprising a nitride, and patterning the sacrificial material with a pattern for a plurality of gates. A top portion of the substrate is recessed, and a material is epitaxially grown over the recessed top portion of the substrate. An insulating material is formed over the sacrificial material and the epitaxially grown material, and the insulating material is removed from over the sacrificial material. The method includes removing the sacrificial material, forming a gate dielectric over the substrate and the insulating material, and forming a gate material over the gate dielectric. The gate material and the gate dielectric are removed from over a top surface of the insulating material, and the insulating material is removed. A contact is formed in spaces where the insulating material was removed from.

In yet other embodiments, a method of forming a semiconductor device includes providing a substrate comprising a plurality of fins, forming a sacrificial material over the substrate, the sacrificial material comprising a nitride, and patterning the sacrificial material with a pattern for a plurality of gates to expose a top surface of the plurality of fins. A top portion of each of the plurality of fins is recessed, and a material is epitaxially grown over the recessed top portion of each of the plurality of fins. The method includes forming a first insulating material over the sacrificial material and the epitaxially grown material, planarizing the first insulating material to remove the first insulating material from over a top surface of the sacrificial material, and removing the sacrificial material to expose a top surface of the plurality of fins. A gate dielectric is formed over the plurality of fins and the first insulating material, a gate material is formed over the gate dielectric, and the gate material and the gate dielectric are planarized to remove the gate material and the gate dielectric from over a top surface of the first insulating material. The method includes forming a second insulating material over the first insulating material, the gate dielectric, and the gate material, removing the second insulating material and the first insulating material from over the epitaxially grown material, and forming a plurality of contacts over the epitaxially grown material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a sacrificial material over a substrate, the sacrificial material comprising a nitride;
    patterning the sacrificial material with a pattern to remove a first portion of the sacrificial material, a second portion of the sacrificial material forming a plurality of dummy gates;
    recessing a top portion of the substrate;
    epitaxially growing a material over the recessed top portion of the substrate, the epitaxially grown material contacting the sacrificial material of a first dummy gate of the plurality of dummy gates and the sacrificial material of a second dummy gate of the plurality of dummy gates;
    forming an insulating material over the sacrificial material and the epitaxially grown material;
    removing the insulating material from over the sacrificial material;
    removing the sacrificial material;
    forming a gate dielectric over the substrate and the insulating material;
    forming a gate material over the gate dielectric;
    removing the gate material and the gate dielectric from over a top surface of the insulating material;
    removing the insulating material; and
    forming a contact in spaces where the insulating material was removed, wherein the contact has a width equal to a width of the epitaxially grown material, wherein the width of the contact is substantially constant.

2. The method according to claim 1, wherein forming the sacrificial material comprises forming silicon nitride.

3. The method according to claim 1, wherein the substrate comprises a plurality of fins, wherein forming the sacrificial material comprises forming the sacrificial material over the plurality of fins of the substrate, wherein patterning the sacrificial material comprises exposing a top surface of the plurality of fins, and wherein recessing the top portion of the substrate comprises recessing a top portion of each of the plurality of fins.

4. The method according to claim 3, wherein the plurality of fins comprises a first semiconductive material and a second semiconductive material disposed over the first semiconductive material, and wherein recessing the top portion of the substrate comprises removing the second semiconductive material.

5. The method according to claim 4, wherein the second semiconductive material comprises a compound semiconductive material.

6. The method according to claim 3, wherein epitaxially growing the material comprises forming source and drain regions.

7. The method according to claim 1, wherein forming the contacts comprises forming a silicide material over the epitaxially grown material.

8. The method according to claim 7, wherein forming the contacts comprises forming a metal over the silicide material.

9. A method of forming a semiconductor device, the method comprising:
    providing a substrate comprising a plurality of fins;
    forming a sacrificial material over the substrate, the sacrificial material comprising a nitride;
    patterning the sacrificial material, a remaining portion of the sacrificial material after the patterning forming a plurality of dummy gates, the patterning exposing a first portion of a top surface of the plurality of fins;
    recessing a top portion of each of the plurality of fins;
    epitaxially growing a material over the recessed top portion of each of the plurality of fins;
    forming a first insulating material over the sacrificial material and the epitaxially grown material, the first insulating material contacting sidewalls of the sacrificial material, wherein an interface between the first insulating material and the sacrificial material extends continuously from the epitaxially grown material to an upper surface of the sacrificial material distal the substrate, wherein the interface and a sidewall of the epitaxially grown material are in a same plane;
    planarizing the first insulating material to remove the first insulating material from over a top surface of the sacrificial material;
    removing the sacrificial material to expose a second portion of a top surface of the plurality of fins;
    forming a gate dielectric over the plurality of fins and the first insulating material;
    forming a gate material over the gate dielectric, the gate dielectric and the gate material forming a plurality of gate structures;
    planarizing the gate material and the gate dielectric to remove the gate material and the gate dielectric from over a top surface of the first insulating material;
    forming a patterned second insulating material over the gate dielectric and the gate material, wherein the patterned second insulating material exposes the first insulating material;
    removing the first insulating material from over the epitaxially grown material; and
    forming a plurality of contacts over the epitaxially grown material, a contact of the plurality of contacts extending from a first sidewall of a first gate structure to a second sidewall of a second gate structure adjacent the first gate structure, wherein upper surfaces of the plurality of contacts are level with an upper surface of the patterned second insulating material, wherein a width of the plurality of contacts is a same as a width of the epitaxially grown material.

10. The method according to claim 9, wherein forming the gate material comprises forming a gate of a fin field effect transistor (FinFET) device, and wherein epitaxially growing the material comprises forming source and drain regions of the FinFET device.

11. The method according to claim 10, wherein forming the plurality of contacts comprises forming source and drain contacts for the FinFET device.

12. The method according to claim 9, wherein forming the first insulating material or forming the patterned second insulating material comprises forming a contact etch stop layer (CESL) and forming an interlayer dielectric (ILD) over the CESL.

13. The method according to claim 12, wherein forming the first insulating material comprises forming a buffer oxide, before forming the CESL.

14. The method according to claim 9, further comprising forming an interface layer over the plurality of fins and the first insulating material, before forming the gate dielectric.

15. A method of forming a semiconductor device, the method comprising:
    forming a nitride containing layer over a substrate, wherein the nitride containing layer is a sacrificial layer;
    patterning the nitride containing layer;
    recessing a top portion of the substrate;
    epitaxially growing a material over the recessed top portion of the substrate, wherein the epitaxially grown material contacts the nitride containing layer;
    depositing an insulating material over the nitride containing layer and the epitaxially grown material;
    patterning the insulating material to expose the nitride containing layer;
    removing the nitride containing layer to form a first recess, the first recess exposing sidewalls of the insulating material that are substantially perpendicular to a major surface of the substrate;
    forming a gate dielectric over sidewalls and a bottom of the first recess;
    forming a gate material over the gate dielectric;
    patterning the gate material to expose the insulating material;
    removing the insulating material to form a second recess; and
    forming a contact in the second recess, a width of the contact being substantially constant and a same as a width of the epitaxially grown material.

16. The method according to claim 15, wherein the nitride containing layer comprises silicon nitride.

17. The method according to claim 15, wherein the epitaxially grown material comprises a compound semiconductive material.

18. The method according to claim 15, wherein forming a contact in the second recess comprises forming a silicide material over the epitaxially grown material.

19. The method according to claim 18, wherein forming a contact in the second recess comprises forming a metal over the silicide material.

20. The method according to claim 1, further comprising before removing the insulating material, forming a patterned second insulating material over the gate material and the gate dielectric, wherein an upper surface of the patterned second insulating material is level with an upper surface of the contact.

\* \* \* \* \*